(12) United States Patent
Kasai

(10) Patent No.: US 11,425,791 B2
(45) Date of Patent: Aug. 23, 2022

(54) MOUNTING TABLE, AND METHOD OF MANUFACTURING THE MOUNTING TABLE

(71) Applicant: TOKYO ELECTRON LIMITED, Tokyo (JP)

(72) Inventor: Shigeru Kasai, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 148 days.

(21) Appl. No.: 16/713,708

(22) Filed: Dec. 13, 2019

(65) Prior Publication Data

US 2020/0205233 A1    Jun. 25, 2020

(30) Foreign Application Priority Data

Dec. 19, 2018  (JP) ............................. JP2018-237352

(51) Int. Cl.
| | |
|---|---|
| *H05B 1/02* | (2006.01) |
| *B32B 7/027* | (2019.01) |
| *B32B 7/12* | (2006.01) |
| *B32B 37/14* | (2006.01) |
| *H01L 21/687* | (2006.01) |
| *H01L 21/683* | (2006.01) |

(52) U.S. Cl.
CPC ........... *H05B 1/0233* (2013.01); *B32B 7/027* (2019.01); *B32B 7/12* (2013.01); *B32B 37/144* (2013.01); *H01L 21/6831* (2013.01); *H01L 21/68757* (2013.01)

(58) Field of Classification Search
CPC ......... B32B 37/144; B32B 7/027; B32B 7/12; G01R 31/2865; G01R 31/2874; H01L 21/67103; H01L 21/6831; H01L 21/68757; H01L 21/68785; H05B 1/0233
USPC ....................................... 219/444.1
See application file for complete search history.

(56) References Cited

U.S. PATENT DOCUMENTS

2008/0062611 A1\* 3/2008 Himori ............... H01L 21/6833
361/234
2013/0270250 A1\* 10/2013 Pease ................... H05B 1/0233
219/443.1

FOREIGN PATENT DOCUMENTS

| JP | 2007-335709 A | 12/2007 |
|---|---|---|
| JP | 2008-66692 A | 3/2008 |
| KR | 1020110102635 A | 9/2011 |
| KR | 1020160106747 A | 9/2016 |

\* cited by examiner

*Primary Examiner* — Dana Ross
*Assistant Examiner* — Joseph W Iskra
(74) *Attorney, Agent, or Firm* — Nath, Goldberg & Meyer; Jerald L. Meyer; Tanya E. Harkins

(57) ABSTRACT

There is provided a mounting table on which a workpiece is mounted, including: a plurality of layers including a ceiling layer having a front surface on which the workpiece is mounted, and a heating layer formed at a rear surface side of the ceiling layer and configured to heat the ceiling layer, the plurality of layers being stacked above one another. Each of the plurality of layers is formed by a silicon single crystal substrate or a silicon polycrystalline substrate. Each of the plurality of layers is bonded to a different layer which is adjacent in a stacking direction through oxide films formed on the silicon single crystal substrate or the silicon polycrystalline substrate.

10 Claims, 4 Drawing Sheets

MOUNTING TABLE, AND METHOD OF MANUFACTURING THE MOUNTING TABLE

CROSS-REFERENCE TO RELATED APPLICATION

This application is based upon and claims the benefit of priority from Japanese Patent Application No. 2018-237352, filed on Dec. 19, 2018, the entire contents of which are incorporated herein by reference.

TECHNICAL FIELD

The present disclosure relates to a mounting table and a method of manufacturing the mounting table.

BACKGROUND

Patent Document 1 discloses a wafer chuck which is capable of adjusting the temperature of a wafer mounted thereon. The wafer chuck includes a top plate formed of ceramics to which the wafer is adsorptively fixed, a temperature regulator having a cooling jacket and a surface heater which are integrated with the top plate, and a heat insulating plate integrated with the temperature regulator through a heat insulating ring.

PRIOR ART DOCUMENT

Patent Document

Patent Document 1: Japanese Laid-Open Patent Publication No. 2008-066692

SUMMARY

According to one embodiment of the present disclosure, there is provided a mounting table on which a workpiece is mounted, including: a plurality of layers including a ceiling layer having a front surface on which the workpiece is mounted, and a heating layer formed at a rear surface side of the ceiling layer and configured to heat the ceiling layer, the plurality of layers being stacked above one another, wherein each of the plurality of layers is formed by a silicon single crystal substrate or a silicon polycrystalline substrate, and wherein each of the plurality of layers is bonded to a different layer which is adjacent in a stacking direction through oxide films formed on the silicon single crystal substrate or the silicon polycrystalline substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
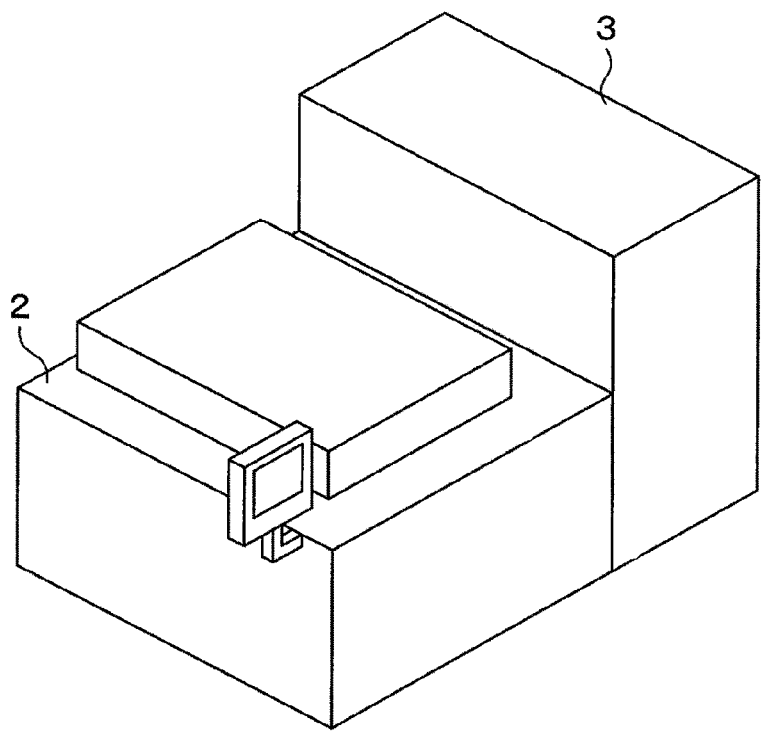
FIG. 1 is a perspective view illustrating an outline of a configuration of an inspection apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor manufacturing process, a plurality of electronic devices having a predetermined circuit pattern is formed on a semiconductor wafer (hereinafter, referred to as a "wafer"). The formed electronic devices are subjected to an electrical characteristic inspection or the like to be sorted into good-quality products and defective products. The inspection of the electronic devices are performed using an inspection apparatus, for example, in the state of the wafer before the electronic devices are divided.

Further, in recent years, there are cases where an inspection apparatus includes a heating means or a cooling means installed on a mounting table, on which the wafer are mounted, to enable inspection of electrical characteristics of the electronic devices at high and low temperatures.

Patent Document 1 discloses a mounting table including a top plate made of ceramics, to which the wafer is adsorptively fixed, and a surface heater integrated with the top plate, as the mounting table as described above.

However, since the ceramics are expensive, there is room for improvement in terms of cost. In addition, there may be a case where the top plate is formed of an inexpensive metal material. In this case, in order to electrically insulate a metal heating element used for the surface heater and the top plate from each other, an electrical insulation portion made of mica or the like is required around the metal heating element. The mica or the like has a large thermal expansion coefficient different from that of an adjacent member such as the top plate or the like. As such, it is necessary to thicken the mica to compensate for the difference in thermal expansion coefficient. Therefore, the use of the mica or the like increases the thermal capacity of the electrical insulation portion. Moreover, although using a silicone resin for the electrical insulation portion described above may be considered, such a silicone resin has low heat resistance, thereby limiting the power density of the surface heater. That is, if the top plate is made of a metal material, high-speed heating using the mounting table cannot be performed in terms of the thermal capacity or the heat resistance of the electrical insulation portion with respect to the surface heater.

Therefore, the present disclosure provides a mounting table that can be heated at a high speed and manufactured at a low cost.

Hereinafter, a mounting table and a method of manufacturing the mounting table according to an embodiment of the present disclosure will be described with reference to the drawings. Further, in the subject specification and the drawings, components having substantially identical functions and configurations will be designated by like reference numerals with the duplicate descriptions thereof omitted.

Figure 2:
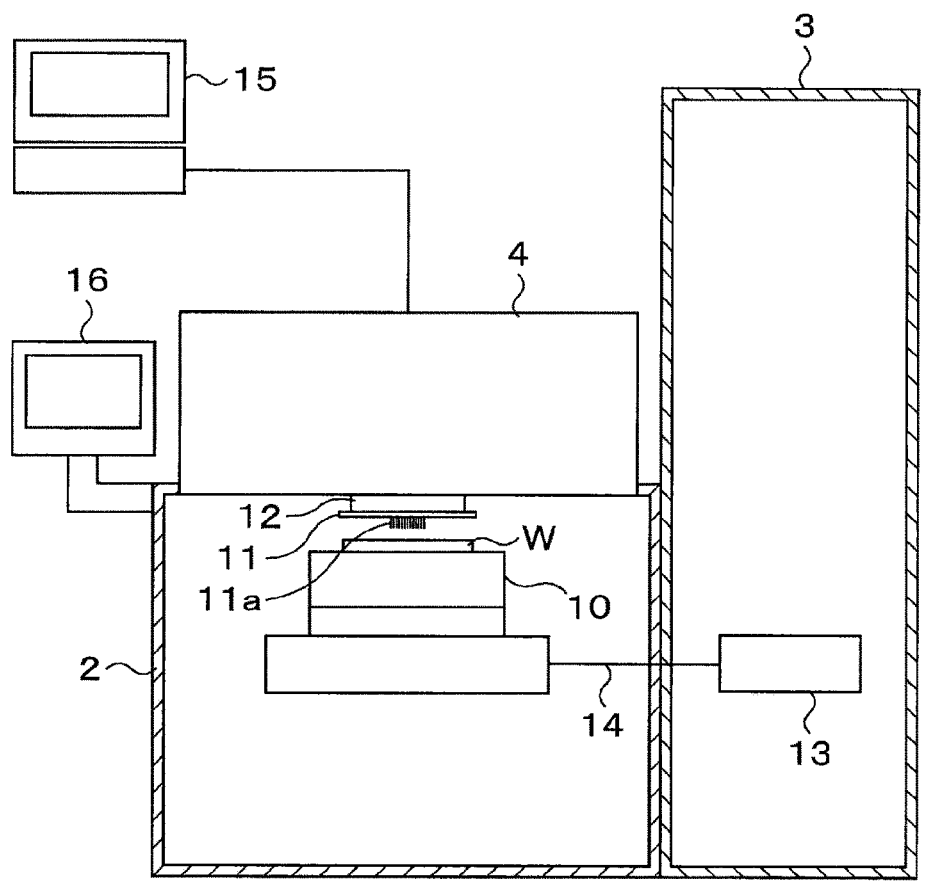
FIG. 2 is a front view illustrating an outline of the configuration of the inspection apparatus according to the present embodiment.

First, a configuration of an inspection apparatus to which a mounting table according to the present embodiment is applied will be described. FIGS. 1 and 2 are respectively a perspective view and a front view illustrating an outline of a configuration of an inspection apparatus 1 having the mounting table according to the present embodiment. In FIG. 2, in order to show components incorporated in an accommodation chamber (to be described later) and a loader (to be described later) of the inspection apparatus 1 of FIG. 1, a portion thereof is shown in cross section.

The inspection apparatus 1 is configured to perform inspection of electrical characteristics of each of a plurality of electronic devices (not shown) formed on a wafer W as a workpiece. As illustrated in FIGS. 1 and 2, the inspection apparatus 1 includes an accommodation chamber 2 in which the wafer W is accommodated during inspection, a loader 3 disposed adjacent to the accommodation chamber 2, and a tester 4 disposed to cover an upper portion of the accommodation chamber 2.

The accommodation chamber 2 is a housing whose interior is hollow, and includes a stage 10 as the mounting table on which the wafer W to be inspected is mounted. The stage 10 adsorptively holds the wafer W so that a position of the wafer W with respect to the stage 10 does not deviate. Furthermore, the stage 10 is configured to be movable in a horizontal direction and a vertical direction. With this configuration, it is possible to adjust a relative position between a probe card 11 (to be described later) and the wafer W, and to bring electrodes on a front surface of the wafer W into contact with probes 11a of the probe card 11.

The probe card 11 is disposed above the stage 10 in the accommodation chamber 2 so as to face the stage 10. The probe card 11 has the probes 11a which are in electrical contact with the electrodes or the like of the electronic devices formed on the wafer W.

Further, the probe card 11 is coupled to the tester 4 via an interface 12. Each of the probes 11a makes contact with the electrode of each electronic device on the wafer W during the electrical characteristic inspection, supplies power from the tester 4 to the respective electronic device via the interface 12, and transmits a signal from the respective electronic device to the tester 4 via the interface 12.

The loader 3 takes out the wafer W accommodated in a FOUP (not shown) as a transfer container and transfers the same to the stage 10 in the accommodation chamber 2. In addition, the loader 3 receives the wafer W in which the electronic devices have been subjected to the electrical characteristic inspection from the stage 10, and accommodates the same in the FOUP.

Further, the loader 3 includes a controller 13 that performs various controls such as temperature control of the electronic devices to be inspected. The controller 13, which will also be referred to as a base unit, is coupled to the stage 10 via a wiring 14. The controller 13 controls a voltage to be applied to a heating layer 130 (to be described later) and a flow rate of a cooling medium to be supplied to a cooling layer including a lid layer 140 and a groove layer 150 (both to be described later) based on a temperature of the electronic devices on the wafer W and a temperature of a ceiling layer 110 (to be described later) of the stage 10. The controller 13 may be installed in the accommodation chamber 2.

The tester 4 has a test board (not shown) that reproduces a portion of a circuit configuration of a motherboard on which the electronic devices are mounted. The test board is connected to a tester computer 15 that determines a quality of the electronic devices based on a signal from the respective electronic device. In the tester 4, circuit configurations of a plural kinds of motherboards may be reproduced by replacing the test board with another one.

In addition, the inspection apparatus 1 includes a user interface part 16 for suitably displaying user information thereon, or by which the user inputs an instruction. The user interface part 16 includes, for example, an input part such as a touch panel, a keyboard or the like, and a display part such as a liquid crystal display or the like.

In the inspection apparatus 1 including the aforementioned components, the tester computer 15 transmits data to the test board connected to the electronic devices through each probe 11a during the electrical characteristic inspection of the electronic devices. Then, the tester computer 15 determines whether or not the transmitted data is correctly processed by the respective test board based on an electrical signal from the respective test board.

Figure 3:
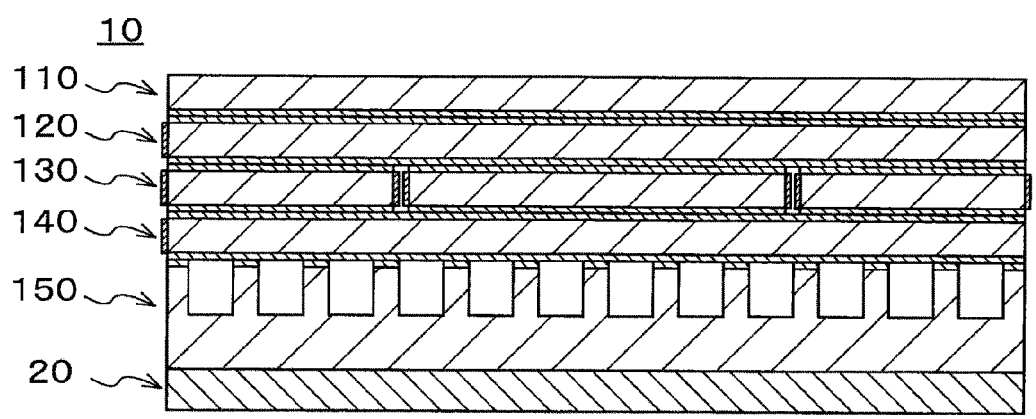
FIG. 3 is a cross-sectional view schematically illustrating a configuration of a mounting table in FIG. 2.
Figure 4:
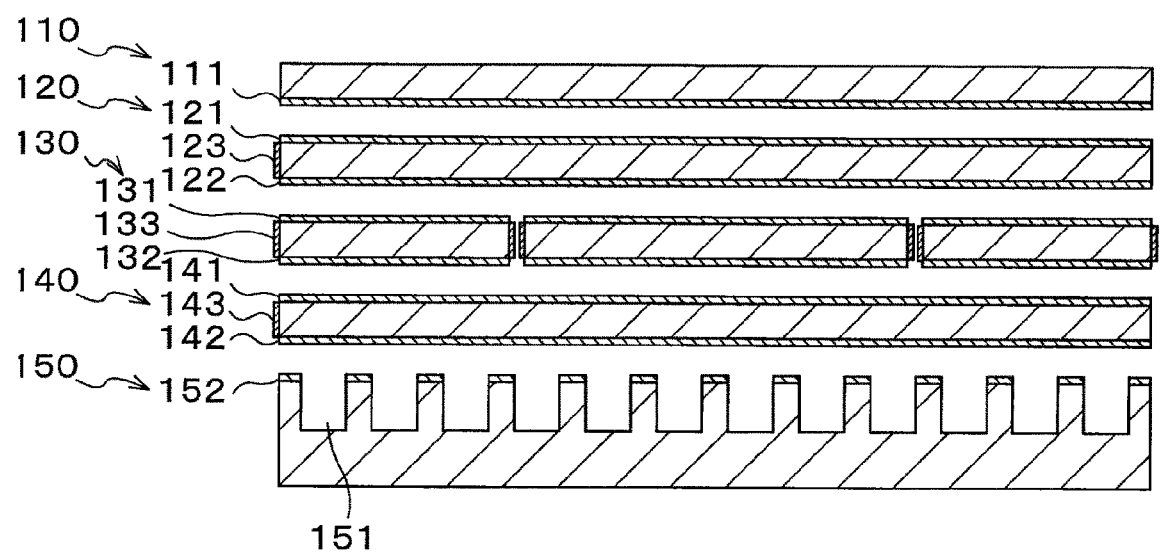
FIG. 4 is a cross-sectional view obtained by dividing the mounting table of FIG. 2 into layers.
Figure 5:
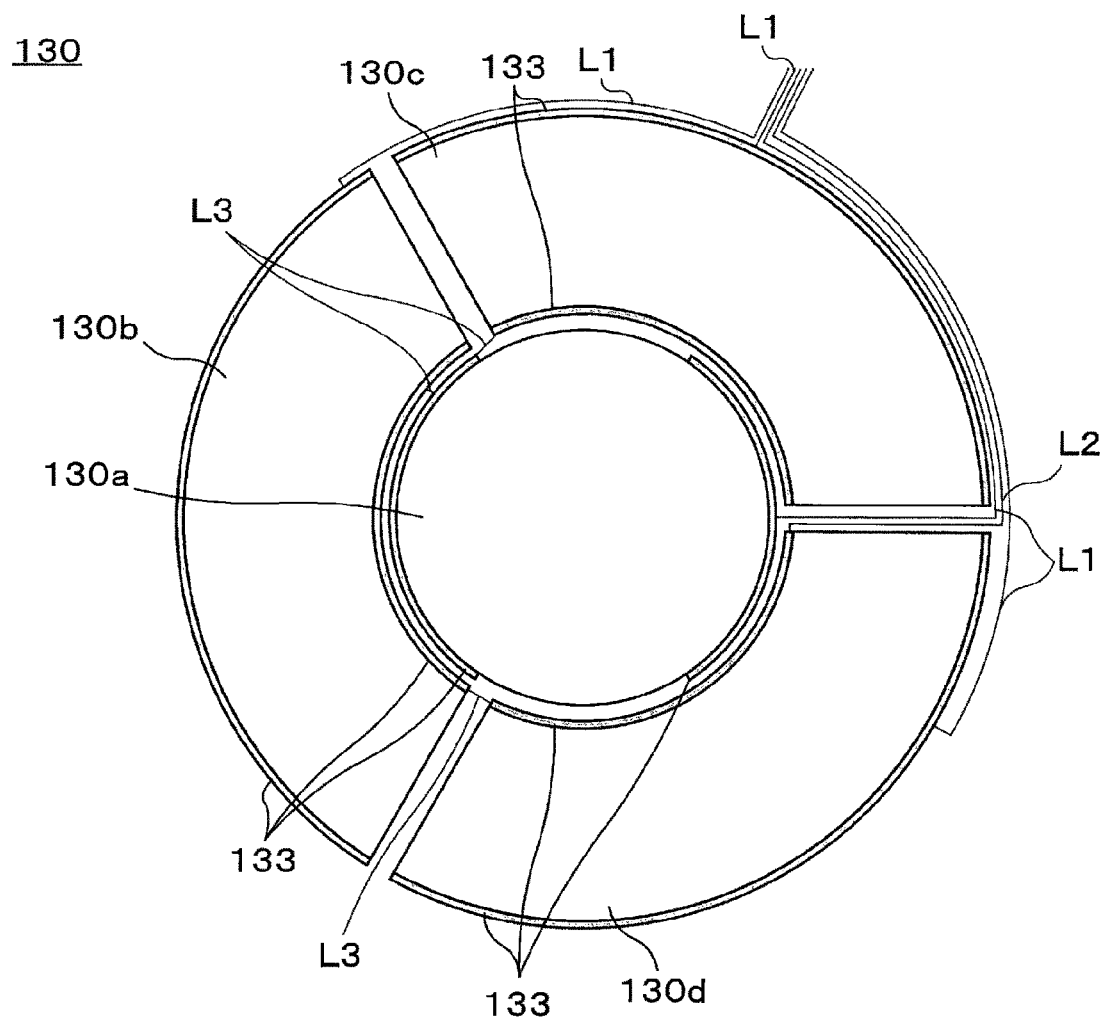
FIG. 5 is a plan view schematically illustrating a configuration of a heating layer in FIG. 3.

Next, a configuration of the stage 10 will be described with reference to FIGS. 3 to 5. FIG. 3 is a cross-sectional view schematically illustrating the configuration of the stage 10. FIG. 4 is a cross-sectional view obtained by dividing the stage 10 into layers in order to show each layer constituting the stage 10. FIG. 5 is a plan view schematically illustrating a configuration of the heating layer as described later.

As illustrated in FIGS. 3 and 4, the stage 10 is formed by stacking a plurality of layers including the heating layer 130 and the like above one another. The stage 10 is mounted on a moving mechanism (not shown) that moves the stage 10 in the horizontal direction and the vertical direction through a heat insulating part 20. The heat insulating part 20 may be made of resin, graphite, ceramic having low thermal conductivity, or the like.

In the example of FIGS. 3 and 4, the respective layers constituting the plurality of layers of the stage 10 are, sequentially from the top, the ceiling layer 110, an electromagnetic shield layer 120, the heating layer 130, the lid layer 140, and the groove layer 150. As will be described below, each of the plurality of layers is formed by a silicon (Si) single crystal substrate.

The ceiling layer 110 is a layer in which the wafer W is mounted on its front surface. The ceiling layer 110 is formed by a Si single crystal substrate. A Si oxide film 111 as an oxide film is formed on a rear surface of the ceiling layer 110.

The electromagnetic shield layer 120 is a layer installed between the ceiling layer 110 and the heating layer 130, and suppresses electromagnetic waves generated by the heating layer 130 from being radiated from the side of the ceiling layer 110 of the stage 10 to the outside. The electromagnetic shield layer 120 is formed by a Si single crystal substrate having high conductivity with high concentration of impurity added thereto. Si oxide films 121 and 122 are formed on a front surface and a rear surface of the electromagnetic shield layer 120, respectively. An electrode 123 is formed on a side surface of the electromagnetic shield layer 120. The electromagnetic shield layer 120 is coupled to a ground potential or a potential with low output impedance via the electrode 123.

The heating layer 130 is a layer which heats the ceiling layer 110, and is installed on the side of the rear surface of the ceiling layer 110. More specifically, the heating layer 130 is formed immediately below the electromagnetic shield layer 120. The heating layer 130 is formed by a Si single crystal substrate having high conductivity with high concentration of impurity added thereto. Si oxide films 131 and 132 are formed on a front surface and a rear surface of the heating layer 130, respectively. Electrodes 133 are formed on respective side surfaces of the heating layer 130. More specifically, as illustrated in FIG. 5, the heating layer 130 is divided into a plurality of divided bodies 130a to 130d in a plan view (i.e., as viewed in the stacking direction). These divided bodies 130a to 130d are configured to be individually controlled. Furthermore, each of the divided bodies 130a to 130d is formed by a Si single crystal substrate having high conductivity with high concentration of impurity added thereto. The Si oxide films 131 and 132 are formed on the front surface and the rear surface of the heating layer 130. The electrodes 133 are formed on the respective side surfaces of the heating layer 130.

In the plurality of divided bodies 130a to 130d, the divided body 130a is located at the center, and the divided bodies 130b to 130d (hereinafter, referred to as "outer divided bodies 130b to 130d") are located to surround the divided body 130a.

The divided body 130a located at the center is formed in a circular shape in a plan view. The electrodes 133 are formed on the side surfaces facing each other in the divided body 130a.

The outer divided bodies 130b to 130d are formed in a circular arc shape in a plan view. The electrodes 133 are formed on both side surfaces of each of the outer divided bodies 130b to 130d in the radial direction.

In addition, among the electrodes 133 formed as the divided bodies 130a to 130d, an electric wire L1 is connected from the outside to each of the electrodes 133 serving as a signal potential.

Further, among the electrodes 133 formed as the divided bodies 130a to 130d, an electric wire L2 is connected from the outside to one electrode 133 serving as a ground potential. Other electrodes 133 serving as the ground potential are directly or indirectly connected to the other one of the electrodes 133 via electric wires L3.

Referring back to FIGS. 3 and 4 and continuing the description, the lid layer 140 and the groove layer 150 function as a cooling layer. The cooling layer is a layer which is formed at the side of the rear surface of the ceiling layer 110 and cools down the ceiling layer 110 with a cooling medium.

The groove layer 150 is a layer having grooves 151 which are opened in one direction (upward in FIG. 3) of the stacking direction in the stage 10. The groove layer 150 is formed by a Si single crystal substrate. A Si oxide film 152 is formed on a surface facing the lid layer 140 in the groove layer 150. The aforementioned grooves 151 are formed in the groove layer 150.

The lid layer 140 is a layer formed on the groove layer 150 so as to cover openings of the grooves 151 of the groove layer 150, and forms a passage of cooling water used as the cooling medium together with the grooves 151. In the present embodiment, the lid layer 140 also serves as an electromagnetic shield layer that suppresses electromagnetic waves generated by the heating layer 130 from being radiated outward from the side of the rear surface of the stage 10 (the opposite side of the ceiling layer 110). When the electromagnetic waves are radiated from the side of the rear surface of the stage 10, the electromagnetic waves may be reflected inside the accommodation chamber 2 of the inspection apparatus 1 and may reach the wafer W. This may affect the electrical characteristic inspection. The electromagnetic shield layer is provided to prevent such a problem.

The lid layer 140 described above is formed by a Si single crystal substrate having high conductivity with high concentration of impurity added thereto. Si oxide films 141 and 142 are formed on front and rear surfaces of the lid layer 140, respectively. An electrode 143 is formed on a side surface of the lid layer 140. The lid layer 140 is coupled to the ground potential or potential having low output impedance via the electrode 143.

Next, a method of manufacturing the stage 10 will be described.

The manufacturing method of the stage 10 includes an individual layer producing process of manufacturing each of the plurality of layers including the heating layer 130 by forming Si oxide films on both surfaces or one surface of the Si single crystal substrate and, and a bonding process of bonding layers adjacent to each other in the stacking direction of the plurality of layers through the Si oxide films. Hereinafter, the individual layer producing process and the bonding process will be described in detail.

The individual layer producing process described above includes (A) a ceiling layer producing step, (B) an electromagnetic shield layer producing step, (C) a heating layer producing step, (D) a lid layer producing step, and (E) a groove layer producing step. Further, the diameter of the Si single crystal substrate used at each step may be, for example, 300 mm, and the thickness of each layer may be 0.5 to 10 mm. In addition, the thickness of the Si oxide film formed at each step may be 1 to 10 μm. Furthermore, in the following description, each electrode used at the heating layer producing step and the like is assumed to be a metal film.

(A) Ceiling Layer Producing Step

In this step, the ceiling layer 110 is produced by forming the Si oxide film 111 on the rear surface of the ceiling layer 110 in a Si single crystal substrate formed by cutting a Si ingot, using a thermal oxidation process.

(B) Electromagnetic Shield Layer Producing Step

In this step, the Si oxide films 121 and 122 are formed on the front and rear surfaces of a Si single crystal substrate, which is formed by cutting a Si ingot added with high concentration of impurity, by a thermal oxidation process. At the same time, the electrode 123 is formed on the side surface of the Si single crystal substrate by a metallization process. In this manner, the electromagnetic shield layer 120 is produced.

(C) Heating Layer Producing Step

In this step, a Si single crystal substrate formed by cutting a Si ingot added with high concentration of impurity is further cut into the shapes of the divided bodies 130a to 130d of a heating layer 130. The Si oxide films 131 and 132 are formed on the front and rear surfaces of each of the divided bodies 130a to 130d thus cut by a thermal oxidation process. At the same time, the electrodes 133 are formed on the respective side surfaces of each of the divided bodies 130a to 130d by a metallization process. In this manner, the divided bodies 130a to 130d of the heating layer 130 are produced. Further, in this step, the electric wires L1 to L3 are connected to the divided bodies 130a to 130d.

(D) Lid layer Producing Step

In this step, the Si oxide films 141 and 142 are formed on the front and rear surfaces of a Si single crystal substrate formed by cutting a Si ingot added with high concentration of impurity, by a thermal oxidation process. At the same time, the electrode 143 is formed on the side surface of the Si single crystal substrate by a metallization process. In this manner, the lid layer 140 is produced.

(E) Groove Layer Producing Step

In this step, the grooves 151 are formed in a surface facing the rear surface of the lid layer 140 in a Si single crystal substrate formed by cutting a Si ingot, by etching or machining. Furthermore, the Si oxide film 152 is formed on a surface facing the rear surface of the lid layer 140 in the Si single crystal substrate by a thermal oxidation process. In this manner, the groove layer 150 is produced.

In addition, in order to appropriately perform bonding in the boding process, planarization is required on a bonding surface of the Si oxide film. Thus, the aforementioned thermal oxidation process may be performed after the etching. Furthermore, in a case where the thermal oxidation process is performed before the etching, the Si oxide film 152 is planarized after the etching.

In the bonding process, the bonding of the ceiling layer 110 and the electromagnetic shield layer 120 through the Si oxide film 111 and the Si oxide film 121, the bonding of the electromagnetic shield layer 120 and the heating layer 130 through the Si oxide film 122 and the Si oxide films 131, the bonding of the heating layer 130 and the lid layer 140 through the Si oxide films 132 and the Si oxide film 141, and the bonding of the lid layer 140 and the groove layer 150 through the Si oxide film 142 and the Si oxide films 152 are performed. In addition, as described above, the Si oxide film of each layer is formed by the thermal oxidation process used in the semiconductor manufacturing process, or subjected to the planarization process after the etching process. Therefore, the bonding surface of the Si oxide film of each layer has an average roughness Ra of 1 nm level and a maximum roughness Rmax of about 10 nm, and has high planarization.

For example, a plasma activation low-temperature bonding is used in bonding between the layers through the Si oxide films. In the plasma activation low-temperature bonding, the bonding surfaces of the Si oxide films are activated by a plasma process at room temperature, and then the Si oxide films of the layers are brought into close contact with each other. Thereafter, the layers are bonded to each other through the Si oxide films by heat treatment at a low temperature (e.g., 200 degrees C.) of less than 1,000 degrees C.

Further, a room temperature bonding for activating the bonding surfaces using an ion beam or the like may be performed instead of the plasma activation low-temperature bonding.

In addition, in a case where the bonding surfaces of the Si oxide films do not have sufficient planarization to perform the plasma activation low-temperature bonding or the room temperature bonding, the bonding surfaces of the Si oxide films may be planarized in advance.

As described above, in the present embodiment, the stage 10 is formed by stacking the plurality of layers including the ceiling layer 110 and the heating layer 130 above one another. Furthermore, each of the plurality of layers is formed by the Si single crystal substrate, and is bonded to another layer adjacent to each other in the stacking direction through the Si oxide films formed on the Si single crystal substrate. The Si single crystal substrate may be obtained at low cost from the magnitude of application fields in the semiconductor industry. Thus, according to the present embodiment, the stage 10 can be produced at low cost.

In addition, there is no difference in the thermal expansion coefficients between the Si oxide films 131 and 122, which function as the electrical insulation portions for the heating layer 130, and the Si single crystal substrate, which constitutes the heating layer 130 or the electromagnetic shield layer 120. Therefore, it is possible to thin the Si oxide films 131 and 122 as the electrical insulation portions and suppress the thermal capacity of the electrical insulation portions. Furthermore, the power density of the heating layer 130 is rate-limited to the heat resistance of the electrical insulation portions to the heating layer 130. Thus, Si has a melting temperature of about 1,300 degrees C. and high heat resistance. Therefore, the power density of the heating layer 130 can be increased by using the Si oxide films 131 and 122 as the electrical insulation portions. Thus, it is possible to heat the wafer W at high speed using the stage 10.

In addition, the Si oxide film has an insulating property of 8 MV/cm or more. Thus, high insulation resistance can be obtained even if the electrical insulation portions formed by the Si oxide films are thinned.

Furthermore, since the Si oxide films 131 and 122 as the electrical insulation portions can be thinned as described above, thermal conduction can be prevented from being disturbed by the Si oxide films 131 and 122 as the electrical insulation portions.

Moreover, in the present embodiment, since the ceiling layer 110 is formed by the Si single crystal substrate, a wafer mounting surface (the front surface) on which the wafer W is mounted can be planarized. Therefore, it is possible to reduce the thermal resistance between the wafer W and the ceiling layer 110, and thus heat absorption and heating of the wafer W using the stage 10 can be performed at high speed. In addition, since the wafer mounting surface is flattened as described above, when the plurality of electronic devices on the wafer W mounted on the stage 10 and the probes 11*a* of the probe card 11 are brought into contact with each other in batch, the contact state between the electronic devices and the probes 11*a* can be made to be uniform in the plane.

Furthermore, in order to improve the planarization of the wafer mounting surface of the ceiling layer 110, the wafer mounting surface may be thermally oxidized to form the Si oxide films.

Moreover, since Si has a high Young's modulus of 300 GPa, rigidity can be obtained even when it is thin. Thus, the ceiling layer 110 can be made thin using the Si single crystal substrate. Accordingly, it is possible to suppress the thermal capacity of the ceiling layer 110 by thinning the ceiling layer 110, and the heating and cooling of the wafer W using the stage 10 can thus be performed at high speed.

Further, Si has high thermal conductivity of 180 W/m·k. Thus, by using the Si single crystal substrate for the ceiling layer 110, the heating and cooling of the wafer W using the stage 10 can be performed at high speed with in-plane uniformity.

In addition, Si has a volume specific heat of $1.58 \times 10^{-6}$ J/m$^3$, which is lower than aluminum ($2.43 \times 10^{-6}$ J/m$^3$) or copper ($3.4 \times 10^{-6}$ J/m$^3$) in comparison. Thus, the thermal capacity of the ceiling layer 110 can be suppressed by using the Si single crystal substrate for the ceiling layer 110. Therefore, the heating and cooling of the wafer W using the stage 10 can be performed at high speed.

Additionally, in the present embodiment, the heating layer 130 is divided into the plurality of divided bodies 130*a* to 130*d* as viewed in the stacking direction. The plurality of divided bodies 130*a* to 130*d* are configured to be individually controlled. Although a conventional metal heater may also be similarly configured, in the present embodiment, a thickness of the heater (thickness of the heating layer 130) and a distance (thickness) from the heater (the heating layer 130) to the wafer W can be made much thinner Therefore, as compared with the metal heater, the heating of the wafer W by the heater (the heating layer 130) can be easily and accurately controlled with in-plane uniformity.

Further, the power density of the heating layer 130 can be adjusted by adjusting the impurity concentration of the Si single crystal substrate used for the heating layer 130.

Furthermore, in the present embodiment, since the electromagnetic shield layer 120 is provided, it is possible to prevent the electromagnetic waves generated by the heating layer 130 from penetrating the ceiling layer 110 to affect the electrical characteristic inspection of the electronic devices formed on the wafer W that is mounted on the ceiling layer 110.

Moreover, in the present embodiment, the electromagnetic shield layer 120 and the ceiling layer 110 are separately formed. However, the ceiling layer 110 may serve as the electromagnetic shield layer 120 by forming the ceiling layer 110 using the Si single crystal substrate having high conductivity with high concentration of impurity added thereto. Thus, it is possible to suppress the thermal capacity of the entire stage 10 while preventing the electromagnetic waves generated by the heating layer 130 from being emitted from the front surface (the wafer mounting surface) of the stage 10.

Further, in the present embodiment, the lid layer 140 also serves as the electromagnetic shield layer. Thus, it is possible to suppress the thermal capacity of the entire stage 10 while preventing the electromagnetic waves generated by the heating layer 130 from being emitted from the rear surface of the stage 10.

In the present embodiment, each layer of the stage 10 is formed by the Si single crystal substrate, and the bonding between the layers is performed by the Si oxide films. Thus, there is no difference between the thermal expansion coefficients of the respective parts constituting the stage 10. Therefore, almost no thermal stress is generated in the stage 10.

Furthermore, in the present embodiment, the ceiling layer 110 is formed by the Si single crystal substrate. Thus, in the case where the wafer W is formed by a Si substrate, there is no difference between the thermal expansion coefficients of the ceiling layer 110 and the wafer W. Therefore, when the wafer W is thermally expanded or contracted during the electrical characteristic inspection or the like, the wafer W and the ceiling layer 110 do not rub against each other so that scratches or the like are not generated.

In the above embodiment, the electrodes have been described to be metal films and formed by the metallization process. Alternatively, the electrodes may be formed by further adding a high concentration of impurities to an electrode formation surface of the Si single crystal substrate added with a high concentration of impurities, which constitutes the heating layer 130 and the like.

Furthermore, although the electrodes of the heating layer 130 or the like are formed on the side surfaces of the heating layer 130, the electrodes may be formed on the front surface or the rear surface of the heating layer 130. In this case, it is preferable to use electrodes formed by a high concentration impurity addition process. Furthermore, in this case, Si oxide films are formed on the electrodes.

Figure 6:
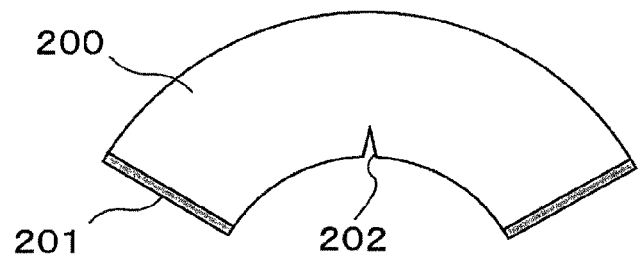
FIG. 6 is a plan view illustrating another example of an outer divided body of the heating layer.

FIG. 6 is a plan view illustrating another example of an outer divided body of the heating layer.

In the outer divided bodies 130b to 130d of the heating layer 130 in FIG. 5, the electrodes 133 are formed on the side surfaces of the heating layer 130 in the radial direction. On the other hand, as shown in FIG. 6, an outer divided body 200 has electrodes 201 formed on side surfaces in a circumferential direction. In addition, as shown in FIG. 6, a slit 202 is formed in an inner lateral portion of the outer divided body 200 in the radial direction. Therefore, since a current flows in a substantially uniform manner inside the outer divided body 200, it is possible to uniformly heat the outer divided body 200.

While in the above embodiment, the stage 10 has been described to be mounted on the inspection apparatus 1, the stage 10 may be used for another workpiece processing apparatus. In addition, the workpiece processing apparatus is an apparatus that performs a predetermined process, such as an inspection process or the like, on a workpiece such as a wafer or the like.

Furthermore, in the above embodiment, each layer constituting the stage 10 has been described to be formed by a Si single crystal substrate, but may be formed by a Si polycrystalline substrate.

In some embodiments, each layer constituting the stage 10 may be formed by a substrate having oxide formed thereon, such as a single crystal substrate or a polycrystalline substrate made of sapphire, alumina, silicon carbide, or diamond.

It should be noted that the embodiments disclosed herein are exemplary in all respects and are not restrictive. The above-described embodiments may be omitted, replaced or modified in various forms without departing from the scope and spirit of the appended claims.

In addition, the following configurations also belong to the technical scope of the present disclosure.

(1) A mounting table on which a workpiece is mounted, includes: a plurality of layers including a ceiling layer having a front surface on which the workpiece is mounted, and a heating layer formed at a rear surface side of the ceiling layer and configured to heat the ceiling layer, the plurality of layers being stacked above one another, wherein each of the plurality of layers is formed by a silicon single crystal substrate or a silicon polycrystalline substrate, and wherein each of the plurality of layers is bonded to a different layer which is adjacent in a stacking direction through oxide films formed on the silicon single crystal substrate or the silicon polycrystalline substrate.

According to the item (1), since each layer of the stage is formed by the silicon single crystal substrate or the silicon polycrystalline substrate which is available at low cost, the stage can be manufactured at low cost. Furthermore, there is no difference in thermal expansion coefficients between the oxide films functioning as electrical insulation portions with respect to the heating layer, and the silicon single crystal substrate or the silicon polycrystalline substrate which constitutes the heating layer. Therefore, it is possible to thin the oxide films used as the electrical insulation portions, thus suppressing the thermal capacity of the electrical insulation portions. In addition, it is possible to increase the power density of the heating layer by using the oxide films as the electrical insulation portions. Thus, it is possible to heat the workpiece at high speed using the stage.

(2) In the mounting table of the item (1), the plurality of layers include a cooling layer formed at the rear surface side of the ceiling layer and configured to cool the ceiling layer.

(3) In the mounting table of the item (2), the cooling layer includes: a groove layer having a groove opened in the stacking direction; and a lid layer formed on the groove layer so as to cover an opening of the groove of the groove layer, the lid layer being configured to form a passage of a cooling medium together with the groove.

(4) In the mounting table of any one of the items (1) to (3), an electrode configured to supply power is formed on a side surface of the heating layer.

(5) In the mounting table of any one of the items (1) to (4), the plurality of layers further includes: a first electromagnetic shield layer formed between the ceiling layer and the heating layer and configured to suppress electromagnetic waves generated by the heating layer from being radiated outward of the mounting table.

(6) In the mounting table of any one of the items (1) to (4), the ceiling layer is formed by the silicon single crystal substrate or the silicon polycrystalline substrate to which an impurity is added, and is also configured to serve as an electromagnetic shield layer that suppresses electromagnetic waves generated by the heating layer from being radiated outward of the mounting table.

According to the item (6), it is possible to suppress the thermal capacity of the entire mounting table while preventing the electromagnetic waves generated by the heating layer from being emitted from the side of the front surface of the ceiling layer, i.e., the side of a mounting surface on which the workpiece is mounted.

(7) In the mounting table of the item (5) or (6), the plurality of layers further includes: a second electromagnetic shield layer formed at a rear surface side of the heating layer.

According to the item (7), it is possible to suppress the thermal capacity of the entire stage while preventing the electromagnetic waves generated by the heating layer from being emitted from the side of the rear surface of the mounting table.

(8) In the mounting table of any one of the items (1) to (7), the heating layer is divided into a plurality of divided bodies as viewed in the stacking direction and the plurality of divided bodies are configured to be individually controlled.

(9) A method of manufacturing a mounting table on which a workpiece is mounted, the mounting table including a plurality of layers including a ceiling layer having a front surface on which the workpiece is mounted, and a heating layer formed at a rear surface side of the ceiling layer and configured to heat the ceiling layer, the plurality of layers being stacked above one another, the method including: producing each of the plurality of layers by forming at least one oxide film on at least one surface of a silicon single crystal substrate or a silicon polycrystalline substrate; and bonding the layers that are adjacent to each other in a stacking direction in the plurality of layers through the at least one oxide film.

According to the present disclosure in some embodiments, it is possible to provide a mounting table which can be heated at high speed and can be manufactured at low cost.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A mounting table on which a workpiece is mounted, comprising:
   a plurality of layers including a ceiling layer having a front surface on which the workpiece is mounted, and a heating layer formed at a rear surface side of the ceiling layer and configured to heat the ceiling layer, the plurality of layers being stacked above one another,
   wherein each of the plurality of layers is a silicon single crystal substrate or a silicon polycrystalline substrate, and
   wherein each of the plurality of layers is bonded to an adjacent another one of the plurality of layers in a stacking direction through oxide films formed on the silicon single crystal substrate or the silicon polycrystalline substrate of each of the plurality of layers.

2. The mounting table of claim 1, wherein the plurality of layers comprises a cooling layer formed at the rear surface side of the ceiling layer and configured to cool the ceiling layer.

3. The mounting table of claim 2, wherein the cooling layer comprises:
   a groove layer having a groove opened in the stacking direction; and
   a lid layer formed on the groove layer so as to cover an opening of the groove of the groove layer, the lid layer being configured to form a passage of a cooling medium together with the groove.

4. The mounting table of claim 3, wherein an electrode configured to supply power is formed on a side surface of the heating layer.

5. The mounting table of claim 4, wherein the plurality of layers further comprises:
   a first electromagnetic shield layer formed between the ceiling layer and the heating layer and configured to suppress electromagnetic waves generated by the heating layer from being radiated outward of the mounting table.

6. The mounting table of claim 5, wherein the plurality of layers further comprises:
   a second electromagnetic shield layer formed at a rear surface side of the heating layer.

7. The mounting table of claim 6, wherein the heating layer is divided into a plurality of divided bodies as viewed in the stacking direction and the plurality of divided bodies are configured to be individually controlled.

8. The mounting table of claim 1, wherein an electrode configured to supply power is formed on a side surface of the heating layer.

9. The mounting table of claim 1, wherein the plurality of layers further comprises:
   an electromagnetic shield layer formed between the ceiling layer and the heating layer and configured to suppress electromagnetic waves generated by the heating layer from being radiated outward of the mounting table.

10. The mounting table of claim 1, wherein the ceiling layer is formed by the silicon single crystal substrate or the silicon polycrystalline substrate to which an impurity is added, and is also configured to serve as an electromagnetic shield layer that suppresses electromagnetic waves generated by the heating layer from being radiated outward of the mounting table.

* * * * *